(12) United States Patent
Lee

(10) Patent No.: US 6,766,225 B2
(45) Date of Patent: Jul. 20, 2004

(54) METHOD FOR PREDICTING DYNAMIC BEHAVIOR CHARACTERISTICS OF A VEHICLE USING SCREW THEORY

(75) Inventor: Unkoo Lee, Hwaseong (KR)

(73) Assignee: Hyundai Motor Company, Seoul (KR)

( * ) Notice: Subject to any disclaimer, the term of this patent is extended or adjusted under 35 U.S.C. 154(b) by 0 days.

(21) Appl. No.: 10/441,847

(22) Filed: May 19, 2003

(65) Prior Publication Data

US 2004/0006410 A1 Jan. 8, 2004

(30) Foreign Application Priority Data

Jul. 8, 2002 (KR) ................................. 10-2002-0039430

(51) Int. Cl.[7] ................................................ G06F 7/00
(52) U.S. Cl. ............................................................ 701/1
(58) Field of Search ......................................... 701/1, 72

(56) References Cited

U.S. PATENT DOCUMENTS 4,359,991 A * 11/1982 Stumpp et al. ............. 123/478
4,719,445 A    1/1988 Fremd
5,747,683 A *  5/1998 Gerum et al. ............... 73/118.1

FOREIGN PATENT DOCUMENTS

JP       03-033940       2/1991

* cited by examiner

Primary Examiner—Yonel Beaulieu
(74) Attorney, Agent, or Firm—Morgan Lewis & Bockius LLP

(57) ABSTRACT

A vehicle model is developed for a quasi-static analysis. The quasi-static analysis is performed for the vehicle model under a cornering condition in which a specific lateral force acts. A finite screw axis is determined based on a rigid body displacement of the vehicle model with respect to the ground through the quasi-static analysis. A fixed screw axis surface formed by a migration of the finite screw axis is also determined. The gradients of screw parameters with respect to lateral forces when the vehicle model behaves in an initial cornering state are calculated. Roll behavior is then estimated based on the fixed screw axis surface and gradients of screw parameters.

17 Claims, 7 Drawing Sheets

Front wheel constraint
X=fn(vertical wheel stroke)

Rear wheel constraint
X=Free

Front wheel constraint
X=Fixed

Rear wheel constraint
X=Free (A)

| Gradients of screw parameters | Correlation with vehicle motion | Model | Value of gradient | Roll performance estimation | Results of analysis for full vehicle model |
|---|---|---|---|---|---|
| $\dfrac{\partial y}{\partial F_y}$ | Vertical migration of body CG(lift up/down) Roll stiffness | 1 | -385 | Negative value (inner direction) → body CG lift down Positive value(outer direction) → body CG lift up | -Very large body CG lift down in model 1 -Body CG lift up in model 2 |
| | | 2 | 215 | | |
| | | 3 | -53 | | |
| $\dfrac{\partial z}{\partial F_y}$ | Roll moment, and Lateral migration of body CG | 1 | -9.17 | Negative value → increase of lateral migration of body CG and roll angle | Roll angle : model 1 > model 3 > model 2 |
| | | 2 | 2.25 | | |
| | | 3 | -0.14 | | |
| $\dfrac{\partial u_y}{\partial F_y}$ | Body pitch | 1 | -0.25 | Negative value (inner direction) → slant of Body CG in a forward direction | Model 1 → pitch down Models 2 and 3 → pitch up |
| | | 2 | 0.028 | | |
| | | 3 | 0.042 | | |
| $\dfrac{\partial u_z}{\partial F_y}$ | Body yaw | 1 | -0.0038 | Negative value → forward rotation of body, and decrease of yaw motion | Yaw rate : model 3 > model 2 > model 1 |
| | | 2 | 0.0003 | | |
| | | 3 | 0.0006 | | |
| $\dfrac{\partial s_{pitch}}{\partial F_y}$ | Cornering speed | 1 | -85 | Positive value → forward migration along the screw axis during roll | During diagonal roll, forward direction component of roll speed varies according to rearward direction component by |
| | | 2 | 2.1 | | |
| | | 3 | 7.8 | | |

METHOD FOR PREDICTING DYNAMIC BEHAVIOR CHARACTERISTICS OF A VEHICLE USING SCREW THEORY

FIELD OF THE INVENTION

The present invention relates to a method for predicting dynamic behavior characteristics of a vehicle using screw theory.

BACKGROUND OF THE INVENTION

It is quite difficult to exactly predict vehicle motion characteristics. However, these characteristics are very important factors that may affect a degree of a driver's fatigue, and the drivability and stability of a vehicle. Therefore, when developing a new vehicle, a design target for such vehicle motion characteristics is predetermined, and overall geometry of a vehicle is determined such that the predetermined target can be achieved.

If vehicle development is performed without a prediction of vehicle motion characteristics, development through trial and error is required. This substantially increases development costs and the probability of failure. Therefore, during vehicle development, a suspension system is first designed and its performance estimated before manufacturing the actual vehicle. This development process is repeated until the target criteria have been met. Subsequently, the vehicle is manufactured and the performance of the suspension system tested in actual vehicle tests.

Various conventional methods for estimating the performance of the suspension system have been developed. However, such conventional methods have many drawbacks. For example, typically the front suspension geometry and the rear suspension geometry are independently designed. The performance of the suspension is then optimized by regulating tuning elements of the front suspension system and the rear suspension system.

Furthermore, roll behavior of a vehicle is affected by a relative change between the front and rear wheel suspensions. Therefore, it is difficult to optimize roll behavior of a vehicle through respective estimation of the front wheel suspension and the rear wheel suspension.

In light of the above, it would be desirable to provide a method for predicting roll behavior of a vehicle by simultaneously estimating front wheel suspension and rear wheel suspension changes.

The information disclosed in this Background of the Invention section is only for enhancement of understanding of the background of the invention and should not be taken as an acknowledgement or any form of suggestion that this information forms the prior art that is already known to a person skilled in the art.

SUMMARY OF THE INVENTION

Therefore, a motivation of the present invention is to provide dynamic behavior characteristics of a vehicle, using parameters acquired by a quasi-static analysis and change rates thereof, so that driving safety efficiency can be predicted.

In a preferred embodiment of the present invention, the method for predicting dynamic behavior characteristics of a vehicle suspension comprises: developing a vehicle model for a quasi-static analysis; performing the quasi-static analysis for the vehicle model under a cornering condition in which a specific lateral force acts; determining a finite screw axis based on a rigid body displacement of the vehicle model with respect to the ground through the quasi-static analysis; determining a fixed screw axis surface formed by a migration of the finite screw axis; calculating gradients of screw parameters with respect to the lateral force when the vehicle model behaves in an initial cornering state; and estimating roll behavior based on the fixed screw axis surface and gradients of screw parameters.

It is preferable that a body of the vehicle model is coupled to a contact patch through a spring such that a tire displacement caused by a vertical load can be expressed, wherein the contact patch is configured such that there is no vertical movement, and an equilibrium of lateral forces acting on the vehicle model exists without a structural restraint in a lateral direction.

Preferably, the equilibrium of lateral forces is realized by applying a lateral force that increases at a predetermined rate at a center of gravity of the vehicle model, and by applying corresponding lateral forces to the contact patch.

It is preferable that the vehicle model is structurally restrained in a forward/rearward direction to facilitate determination of a moment equilibrium according to a force equilibrium.

It is also preferable that a front wheel is configured to be restrained and a rear wheel is configured to undergo a forward/rearward movement such that a wheel base change that is brought about during roll behavior by a forward/rearward movement of the contact patch caused by geometries of the front and rear wheel can be reflected in the analysis.

Preferably, a forward/rearward displacement of a front contact patch is measured while bumping and rebounding the vehicle in a state whereby all forward/rearward restraints are removed, and a value obtained by a sine function approximation is used as a front wheel displacement restraint condition.

It is preferable that in the quasi-static analysis, when comparing a plurality of results of the quasi-static analysis for different vehicle models, a camber change tendency and a toe change tendency are set as similar values between the models, and a roll center at an initial position is set to be the same in each model.

It is preferable that in the step of estimating roll behavior, a point where the fixed screw axis intersects a surface that passes through a center of a front wheel and is perpendicular to a vehicle driving direction is considered as a roll center of the front wheel, a point where the fixed screw axis insects a surface that passes through a center of gravity is considered as a roll center of the center of gravity, and a point where the fixed screw axis insects a surface that passes through a center of a rear wheel is considered as a roll center of the rear wheel, and wherein a tendency of change of the roll center at the three points is estimated.

It is also preferable that the screw parameters include a first position parameter relating to a vertical migration of a center of gravity of the vehicle model, a second position parameter relating to a lateral migration of a center of gravity of the model, a first direction parameter relating to a pitch motion of the vehicle model, a second direction parameter relating to a yaw motion of the vehicle model, and a pitch parameter relating to cornering speed.

In another preferred embodiment of the present invention, the method for predicting dynamic behavior characteristics of a vehicle comprises: determining screw parameters and gradients of the screw parameters of a fixed screw axis through an analysis of a quasi-static vehicle model; and estimating roll behavior of the vehicle based on the determined screw parameters and the gradients of the screw parameters.

It is preferable that said determining comprises: applying a lateral force that increases at a predetermined rate at a center of gravity of the quasi-static vehicle model, and simultaneously applying corresponding lateral forces at each contact patch of the quasi-static vehicle model, so that a force equilibrium in a lateral direction and a moment equilibrium exist; and determining the screw parameters and the gradients of the screw parameters of a fixed screw axis based on motions of the quasi-static vehicle model with respect to the ground.

It is also preferable that the screw parameters include a lateral position parameter that relates to a lateral position of the fixed screw axis, and a center of gravity of a vehicle is estimated to lower if a value of the gradient of the lateral position parameter is negative, and a center of gravity of a vehicle is estimated to rise if a value of the gradient of the lateral position parameter is positive.

Preferably, the screw parameters include a vertical position parameter that relates to a vertical position of the fixed screw axis, and it is estimated that a lateral migration of a center of gravity of the vehicle decreases and a roll angle decreases if a value of a gradient of the vertical position parameter is negative.

It is preferable that the screw parameters include a lateral direction component of a unit direction vector of the screw axis, and it is estimated that a vehicle body slants in a forward direction if a value of a gradient of the lateral direction component is negative, and the vehicle body slants in a rearward direction if a value of a gradient of the lateral direction component is positive.

Preferably, the screw parameters include a vertical direction component of a unit direction vector of the screw axis, and a yaw behavior is estimated based on a gradient of the vertical direction component.

It is preferable that the screw parameters include a pitch parameter relating to a translating motion of a vehicle, and it is estimated that the vehicle moves in a forward direction along the screw axis if a value of a gradient of the pitch parameter is positive, and the vehicle moves in a rearward direction along the screw axis if a value of a gradient of the pitch parameter is negative.

It is further preferable that the quasi-static vehicle model comprises a body, and a contact patch that is coupled to the body through a spring, wherein the contact patch is configured to have no structural restraint in a lateral direction.

BRIEF DESCRIPTION OF THE DRAWINGS

The accompanying drawings, which are incorporated in and constitute a part of the specification, illustrate an embodiment of the invention, and, together with the description, serve to explain the principles of the invention, where:

FIG. 9 is a table showing a summary of the prediction of vehicle performance using screw parameter gradients.

DETAILED DESCRIPTION OF THE PREFERRED EMBODIMENTS

Hereinafter, a preferred embodiment of the present invention will be described in detail with reference to the accompanying drawings.

Figure 1:
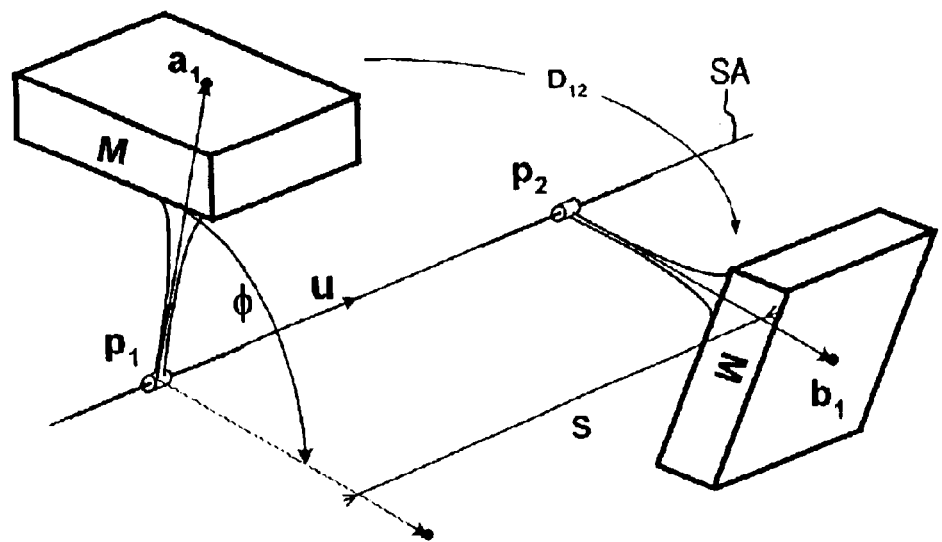
FIG. 1 is an illustration of a rigid body motion in a three dimensional space.

FIG. 1 shows a theoretical background of the present invention: motion of a rigid body in a three-dimensional space is composed of a rotating motion and a translating motion. When these two motions occur, the motion can be defined as a screw motion with respect to one reference axis. A method for analyzing motions of a rigid body using such screw motion is generally referred to as a screw theory. The method according to the preferred embodiment of the present invention utilizes the screw theory.

The reference axis of the screw motion can be called a finite screw axis. As shown in FIG. 1, when a rigid body M has moved from a position $p_1$ to a position $P_2$, an axis SA is a finite screw axis for the two positions $p_1$ and $P_2$.

Figure 2:
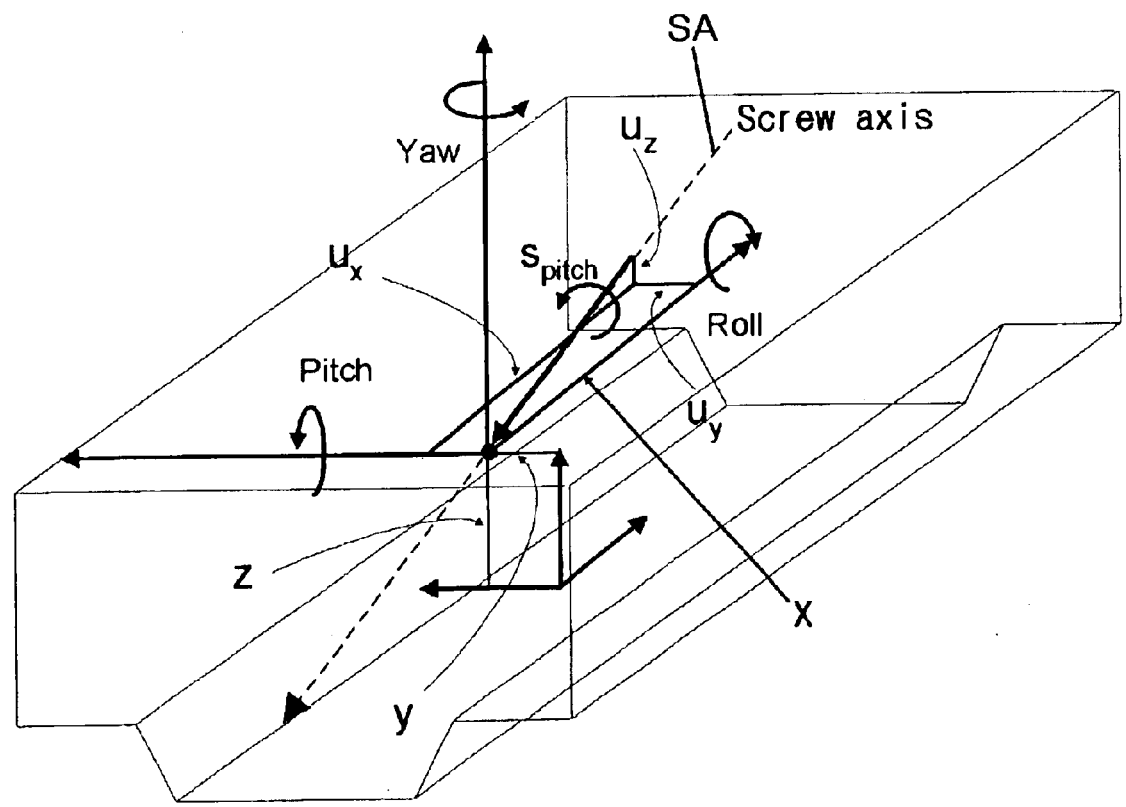
FIG. 2 is a diagram to explain parameters of a rotation axis of a vehicle.

Any motion of a rigid body can be defined as a screw axis motion. In consideration of this, as shown in FIG. 2, fixed rotation axis parameters of a vehicle are composed of seven parameters including three position components of a position vector (x, y, z), three direction components of a unit direction vector ($u_x$, $u_y$, $u_z$), and a pitch component $S_{pitch}$ with respect to a rotating axis.

The position parameter x may be selected as any value on the rotation axis, and in the preferred embodiment of the present invention it is selected as a coordinate value corresponding to a center of gravity of a vehicle. The direction parameter $u_x$ may be expressed by a function of $u_y$ and $u_z$ as follows:

$$u_x = \pm\sqrt{1 - (u_y^2 + u_z^2)}.$$

Accordingly, characteristics of the rotation axis can be understood with five parameters y, z, $u_y$, $u_z$, and $S_{pitch}$.

Roll behavior of a vehicle body is determined by screw axis motions determined by overall geometry including front suspension geometry and rear suspension geometry, and this includes a concept of force-based roll center as well as a concept of geometry-based roll center.

Figure 3:
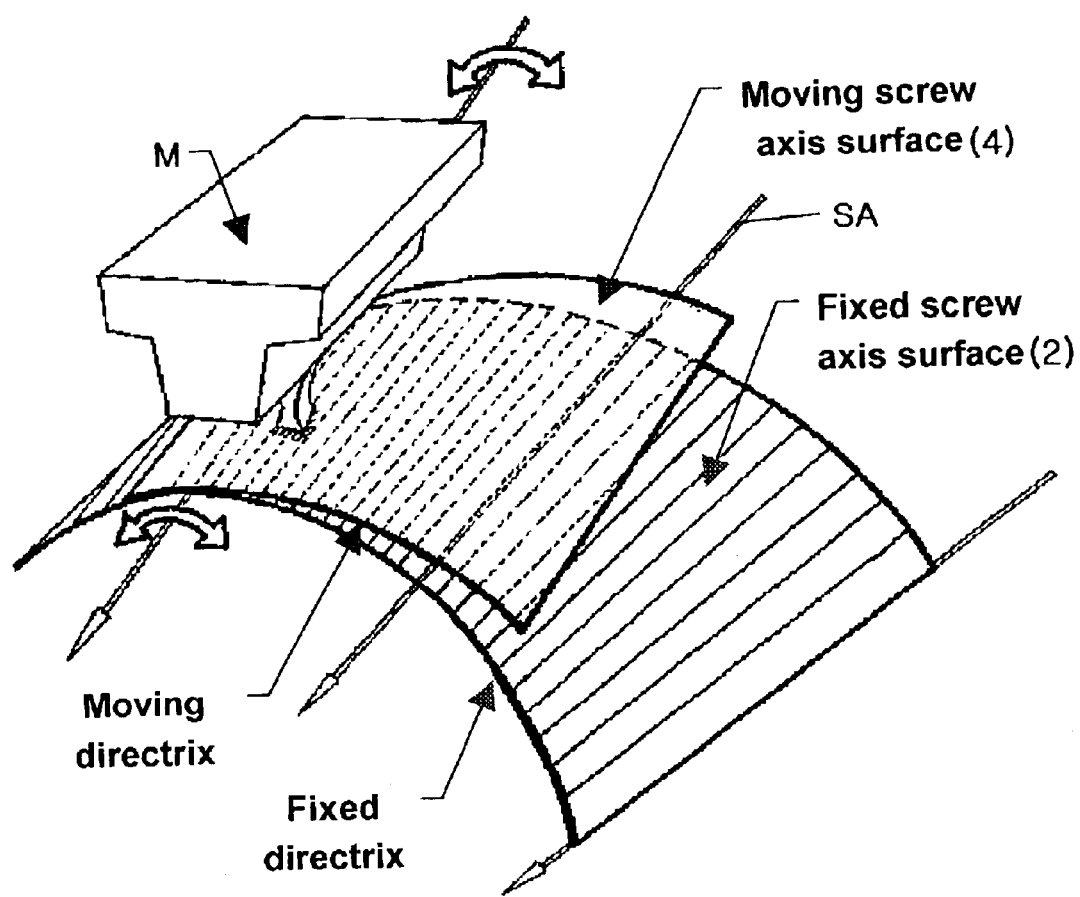
FIG. 3 is an illustration to explain a relation between a fixed screw axis surface and a moving screw axis surface of a quasi-static vehicle model.

As seen in FIG. 3, a surface formed by a plurality of sequential screw axes that are formed while a rigid body moves is defined as a fixed screw axis surface 2, and a surface of the rigid body that rolls on the fixed screw axis surface without sliding is defined as a moving screw axis surface 4. In other words, the fixed screw axis surface is a surface that is formed by a locus of the instantaneous screw axis. So, as shown in FIG. 3, a roll motion of a vehicle is shown by a motion of the moving screw axis surface 4, which represents the rigid body of the vehicle, to roll on the fixed screw axis surface without sliding.

Therefore, roll motion characteristics of a vehicle can be easily predicted through a shape of the fixed screw axis surface 4.

Figure 4:
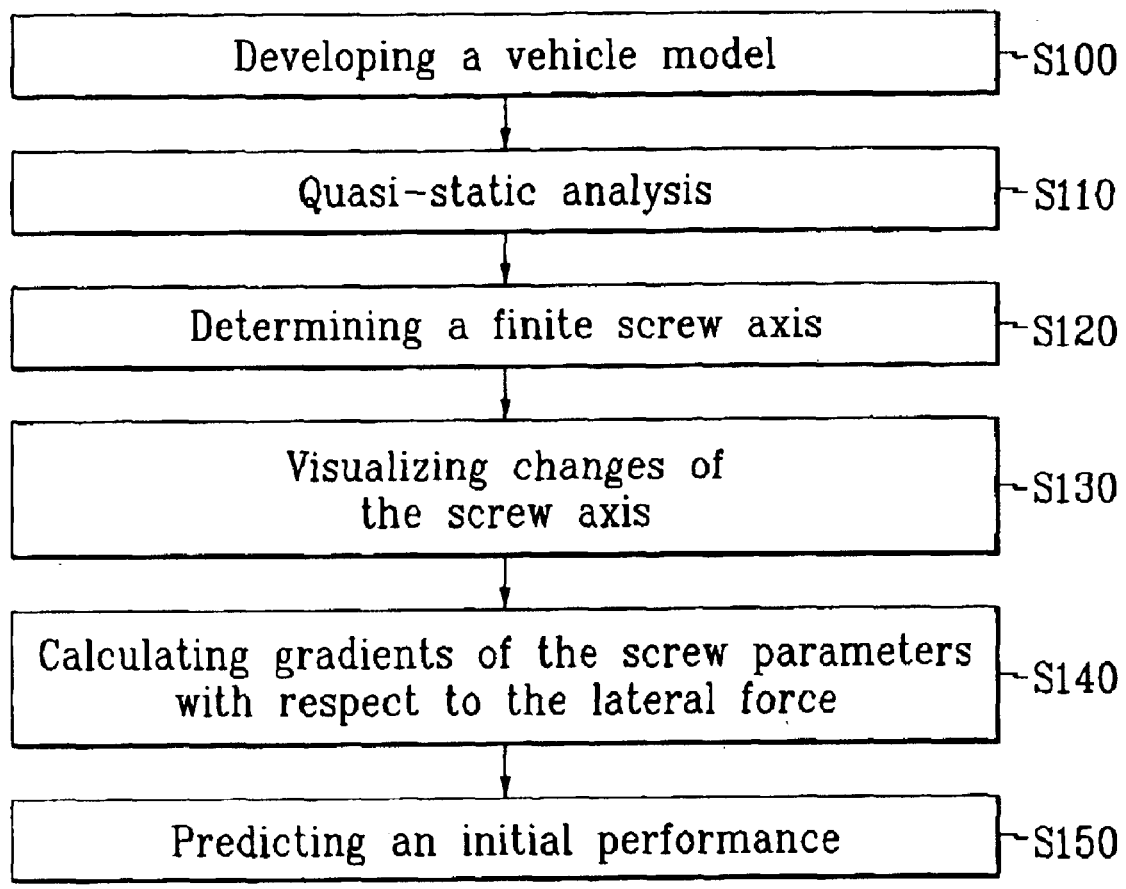
FIG. 4 is a flow chart of a method for predicting roll behavior of a vehicle according to a preferred embodiment of the present invention.

Using the above characteristics, the method for predicting the roll behavior of a vehicle according to the preferred embodiment of the present invention is shown in FIG. 4.

First, a quasi-static vehicle model is manufactured (step S100), and a quasi-static analysis is performed under a turning condition in which lateral force is applied to a vehicle (step S110). Then, a finite screw axis is determined based on a rigid body displacement with respect to the ground (step S120).

Next, at step S130, change of the finite screw axis is visualized, and at step S140, screw parameter gradients are calculated. At step S150, an initial performance is estimated by comparing a shape of changes of the finite screw axis and the screw parameter gradients to those of screw parameters obtained in a real vehicle.

At step S100, although the vehicle model can be altered according to the vehicle being designed, three exemplary types of suspension systems will be explained hereinafter.

| Model | Front suspension | Rear suspension |
| --- | --- | --- |
| 1 | MacPherson strut type | Double wishbone type |
| 2 | Double wishbone type | Double wishbone type |
| 3 | Double wishbone type | MacPherson strut type |

Figure 5:
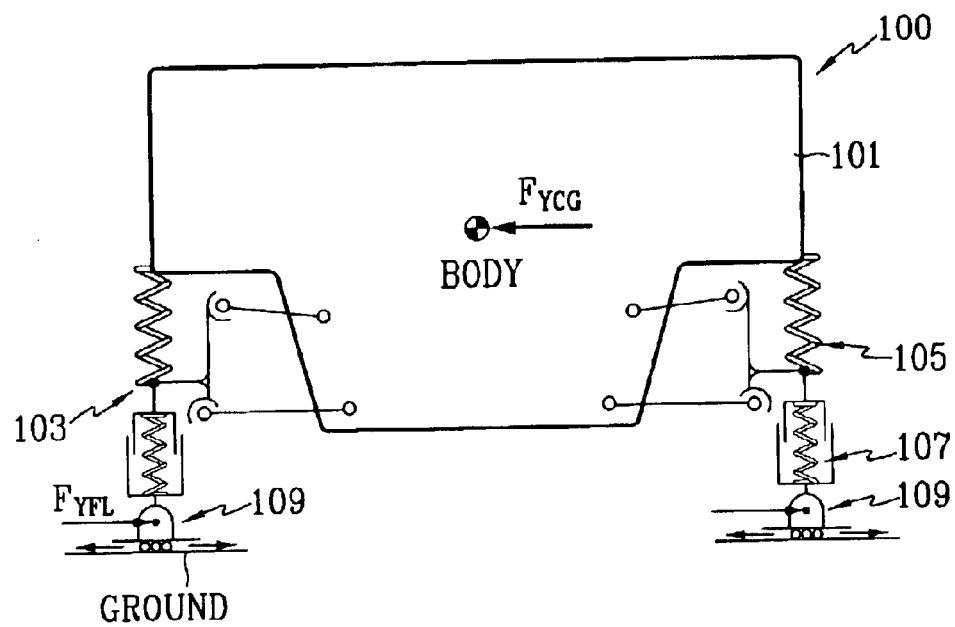
FIG. 5 is a lateral structure diagram of the quasi-static vehicle model.
Figure 6:
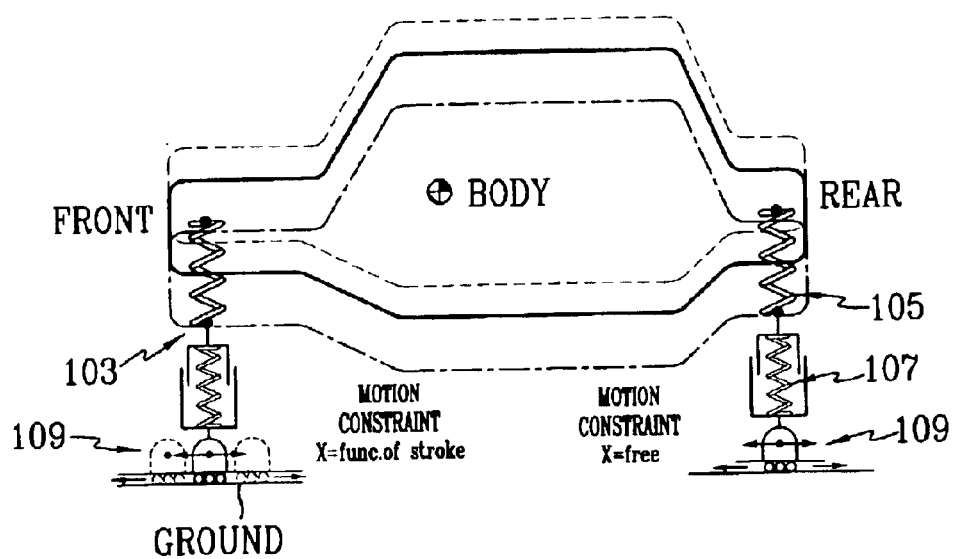
FIG. 6 is a longitudinal structure diagram of the quasi-static vehicle model.

The vehicle models are manufactured for the quasi-static analysis as shown in FIGS. 5 and 6.

More concretely, in the quasi-static model 100, a knuckle 103 is coupled to a contact patch 109 through a tire spring 107 to realize a tire deformation caused by vertical load. Further, rather than a pin joint connection between the contact patch 109 and the ground, it is designed such that there is no lateral mechanical restraint between the contact patch 109 and the ground.

Lateral forces that respectively act on four wheels when a specific level of lateral force acts on a center of gravity of the quasi-static model 100 can be determined through a force equilibrium equation and a moment equilibrium equation.

The lateral force distribution between the front and rear wheels can be known, but the lateral force distribution between the left and right wheels cannot be known, through the two equilibrium equations. So, it is preferable that the lateral force distribution between the left and right wheels is determined as a function of vertical load acting on tires using tire characteristics. For example, the lateral force distribution between the left and right wheels may be calculated using tire lateral force characteristics with respect to vertical load and slip angle.

As shown in FIGS. 5 and 6, in order to realize a roll motion that occurs when a vehicle turns, lateral force $F_{YGC}$ is applied to the quasi-static vehicle model at a center of gravity thereof, and corresponding counter lateral forces, which are determined in the above manner, are applied to contact patches so that lateral force equilibrium is realized. Under this configuration, wheel tread change caused by a bump or a rebound accompanied by the roll behavior may be reflected in a vehicle motion because lateral structural restraint does not exist between the contact patch and the ground.

If lateral forces acting on a left and a right wheel are applied at equal heights from the ground, a moment equilibrium can be achieved. However, in the quasi-static vehicle model that has a similar suspension geometry with a real vehicle, the left and right wheels undergo bump and rebound motion so that a height of a point where lateral force acts may differ. Accordingly, a moment equilibrium cannot be maintained.

In order to prevent an unintended yaw motion, which may occur in a state where the moment equilibrium is not realized, at least one motion restraint in a lateral direction or in a longitudinal direction is required. In the preferred embodiment of the present invention, the longitudinal direction is structurally restrained because an additional restraint in the lateral direction where a force equilibrium condition exists is impossible.

Longitudinal movement of the contact patch by bump and rebound of the wheel occurs with respect to geometry of the front and rear wheels, and this movement causes a change of a wheel base during a roll motion. In order to reflect the change of the wheel base to the analysis, only the front wheel is restrained, and the rear wheel is configured to undergo a forward and a rearward movement.

Figure 7:
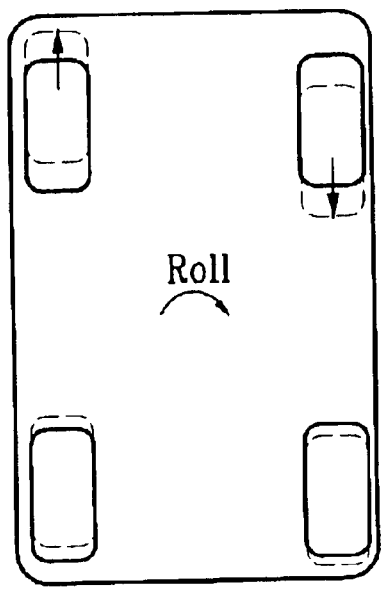
FIG. 7 is an illustration showing a yaw behavior according to front wheel geometry in the quasi-static vehicle model.
Figure 7:
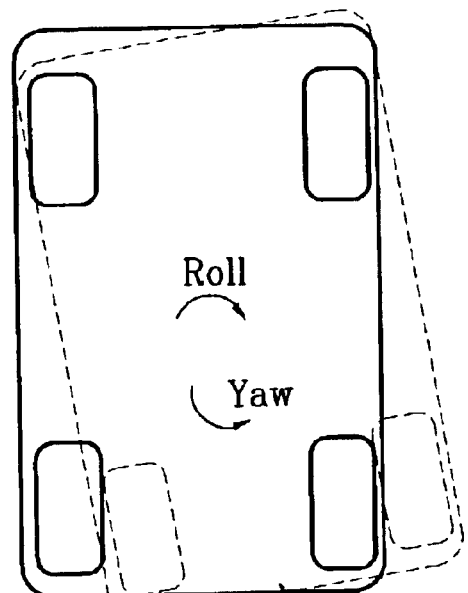

However, if the front wheel is fixed through a structural restraint, as shown in FIG. 7, a yaw behavior may occur as a result of the front wheel geometry. In order to prevent this, it is preferable that a relevant amount of the forward/rearward motion is used as a restraint condition.

In order to set the longitudinal (forward and rearward) motion, a longitudinal displacement of the contact patch of the front wheel is measured when the model bumps and rebounds in a condition in which all longitudinal restraints of the front wheel and the rear wheel are removed, and a value that is obtained through an approximation of a sine function of the measured displacement is utilized as the displacement restriction condition of the front wheel in the roll behavior analysis.

In this method, the longitudinal direction of the front wheel is structurally restrained so that the yaw behavior according to a disequilibrium of the lateral moment can be prevented, and the change of the wheel base according to the geometry change of the front wheel and the rear wheel can be taken into account in the analysis.

Then, according to step S110, the quasi-static analysis for the quasi-static vehicle model is performed using an analysis program. In the embodiment of the present invention, it is preferable that ADAMS[12] is used as the analysis program. The finite screw axes for the roll behavior of the full vehicle will be obtained by calculating position and posture information provided by ADAMS[12] in a subroutine.

In order to prevent confusion of analysis results by factors other than the roll behavior in each model, it is preferable that a camber change tendency and a toe change tendency, which are basic suspension performance factors, are set to be approximately in a range between −50 mm (rebound) and 50 mm (bump), which is considered as a general range, and a height of a roll center at the initial position is set to be the same in each model.

To observe migrations of the finite screw axis obtained in step S110, a point where the finite screw axis intersects a surface that involves a front wheel center and is perpendicular to a vehicle driving direction, a point where the finite screw axis intersects a surface that involves a center of gravity of the vehicle, and a point where the finite screw axis intersects a surface that involves a rear wheel center are determined. By respectively considering these points as a roll center at the front wheel, the center of gravity, and the rear wheel, the changing tendency of the roll center is examined.

Figure 8:
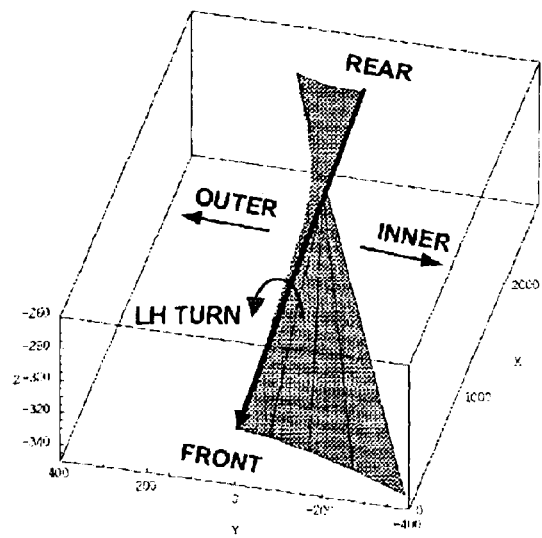
FIG. 8 shows fixed screw axis surfaces in the quasi-static vehicle model.
Figure 8:
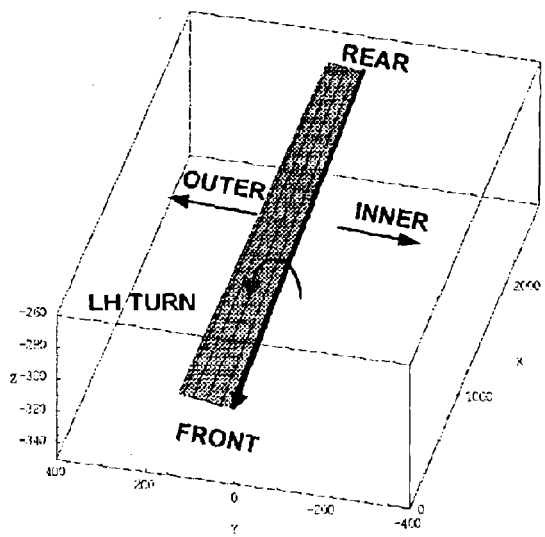
Figure 8:
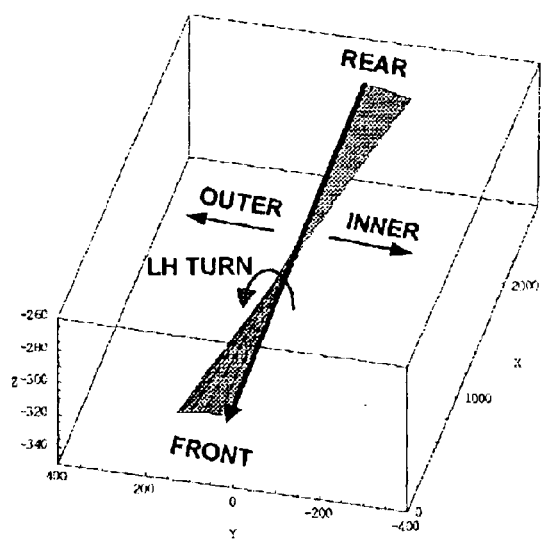

Referring to FIGS. 8 and 9, roll performance may be estimated as follows. FIGS. 8(A), (B), and (C) are illustrations of screw axis surfaces in a state of lateral force of 0.5G, and FIG. 9 is a table for predictions of vehicle performance using screw parameter gradients As shown in (A) of FIG. 8, in the vehicle model 1 (front suspension is a MacPherson strut suspension and rear suspension system is a double wishbone suspension), the roll center of the front wheel greatly migrates in an inner downward direction during cornering, and that of the rear wheel migrates in the outer direction. In the vehicle model 3, however, the roll center of the rear wheel migrates in an inner downward direction during cornering, and that of the front wheel migrates in an outer direction. That is, the screw axis migrates in opposite directions in the vehicle model 1 and model 3.

Lateral change of the roll center relates to a vertical displacement of the center of gravity. Accordingly, in the model 1, referring to (A) of FIG. 8, it may be estimated that the center of gravity of the front wheel lowers (lift down), and the center of gravity of the rear wheel rises (lift up).

Referring to (B) and (C) of FIG. 8, it may be estimated that the center of gravity lowers both in the front wheel and the rear wheel in the model 2, and that the center of gravity of the front wheel rises and the center of the gravity of the rear wheel lowers in the model 3.

Because the vertical displacement of the center of gravity of the front and rear wheels relates to a pitching of a vehicle body, it is estimated that the model 1 slants to a front side (pitch down), and the vehicle model 2 slants to a rear side (pitch up).

Gradients of the screw parameters shown in FIG. 9 are considered as criteria of roll motion of the vehicle, along with the changing tendency of the screw parameters described in the screw axis surfaces of FIG. 8.

The gradients of y, z, and $s_{pitch}$ are in units of mm/G, and the gradients of $u_y$ and $u_z$ are in units of 1/G. According to input conditions, however, the denominator may be changed to force (Kgf), roll angle (degrees), and time (seconds), etc.

More concretely, the gradient of the screw parameter y is −385 for the model 1, 215 for the model 2, and 53 for the model 3.

The negative value of the gradient of the screw parameter y indicates that the screw parameter y migrates in an inner direction as the lateral force acts on the vehicle model, and the positive value of the gradient of the screw parameter y indicates that the screw parameter y migrates in an outer direction as the lateral force acts on the vehicle model.

That is, the screw parameter y of the model 1 migrates in the inner direction during cornering, and the screw parameter y of the models 2 and 3 migrates in the outer direction during cornering.

Further, it can be known that the gradient of the screw parameter y of the model 2 is roughly four times that of the model 3, so the screw parameter y of the model 2 migrates in the outer direction further than that of the model 3.

The gradient of the screw parameter z is −9.17 for the model 1, 2.25 for the model 2, and −0.14 for the model 3. The negative value of the gradient of the screw parameter z indicates that the screw parameter z migrates in a downward direction, and the positive value of the gradient of the screw parameter z indicates that the screw parameter z migrates in an upward direction.

Therefore, the model 2 moves in the upward direction, and the models 1 and 3 move in the downward direction. It is also shown that the model 1 moves in the downward direction further than the model 3.

The gradient of the screw parameter $u_y$ is −0.25 for the model 1, 0.028 for the model 2, and 0.042 for the model 3.

The negative value of the gradient of the screw parameter $u_y$ indicates that the $u_y$ moves in the inner direction with reference to a vertical axis of the vehicle, and to the contrary, the positive value of the gradient of the screw parameter $u_y$ indicates that the $u_y$ moves in the outer direction. Therefore, the model 1 moves in the inner direction during cornering, and models 2 and 3 move in the outer direction during cornering.

When comparing an amount of gradients, the amount of the gradient of the screw parameter $u_y$ of the model 1 is much greater than those of models 2 and 3, and that of model 3 is about twice of that of the model 2.

The gradient of the screw parameter $u_z$ is −0.0038 for the model 1, 0.0003 for the model 2, and 0.00057 for the model 3. The negative value of the gradient of the screw parameter $u_z$ indicates that the vehicle model rotates in a forward direction with reference to a lateral axis of the vehicle model, and the positive value of the gradient of the screw parameter $u_z$ indicates that the vehicle model rotates in a rearward direction with reference to a lateral axis of the vehicle model. Therefore, the model 1 has a tendency to rotate in the forward direction, and the models 2 and 3 have a tendency to rotate in the rearward direction.

The amount of the gradient of the screw parameter $u_z$ of the model 1 is much greater than those of the models 2 and 3, and the amount of the gradient of the screw parameter $u_z$ of the model 3 is two or three times of those of the model 2. Therefore, it is estimated that the model 1 has a tendency to slant in a forward direction during cornering.

The screw axis surfaces may be affected by other vehicle operating parameters, so if necessary, a final performance estimation may be made in consideration of such vehicle operating parameters.

The vehicle operating parameters may include an increase or a decrease of vehicle load, steering input, compliance characteristics, toe change during vertical movement, and roll stiffness.

The affects of the vehicle operating parameters on the screw axis surface may be measured. The change of the screw axis surface according to an increase or a decrease of a load of the vehicle has a constant tendency, so an optimal design of roll geometry is possible by realizing an ideal screw axis surface in a normal operating range.

Further, it can be known that a shape of the screw axis surface is maintained in spite of a change of compliance characteristics according to rubber bushings, etc., a change of toe geometry, and a steering input, and this indicates that the shape of the screw axis surface is not affected by factors of tuning design.

As stated in the above, according to the preferred embodiment of the present invention, a new geometry design parameter (finite screw axis parameter) which includes the front wheel geometry and the rear wheel geometry is developed, and drivability and stability of the suspension system may be estimated using characteristics and gradients of parameters that can be obtained through a quasi-static analysis rather than a dynamic analysis using a complicated model. Therefore, cost and time for designing the suspension system for a vehicle can be substantially decreased.

Although preferred embodiments of the present invention have been described in detail hereinabove, it should be clearly understood that many variations and/or modifications of the basic inventive concepts herein taught which may appear to those skilled in the present art will still fall within the sprit and scope of the present invention, as defined in the appended claims.

Throughout this specification and the claims which follow, unless explicitly described to the contrary, the word "comprise" or variations such as "comprises" or "comprising" will be understood to imply the inclusion of stated elements but not the exclusion of any other elements.

What is claimed is:

1. A method for predicting dynamic behavior characteristics of a vehicle, comprising:
    developing a vehicle model for a quasi-static analysis;
    performing the quasi-static analysis for the vehicle model under a cornering condition in which a specific lateral force acts;
    determining a finite screw axis based on a rigid body displacement of the vehicle model with respect to the ground through the quasi-static analysis;
    determining a fixed screw axis surface formed by a migration of the finite screw axis;
    calculating gradients of screw parameters with respect to the lateral force when the vehicle model behaves in an initial cornering state; and
    estimating roll behavior based on the fixed screw axis surface and gradients of screw parameters.

2. The method for predicting dynamic behavior characteristics of claim 1, wherein a body of the vehicle model is coupled to a contact patch through a spring such that a tire displacement caused by a vertical load can be expressed, wherein the contact patch is configured such that there is no vertical movement, and an equilibrium of lateral forces acting on the vehicle model exists without a structural restraint in a lateral direction.

3. The method for predicting dynamic behavior characteristics of claim 2, wherein the equilibrium of lateral forces is realized by applying a lateral force that increases at a predetermined rate at a center of gravity of the vehicle model, and by applying corresponding lateral forces to the contact patch.

4. The method for predicting dynamic behavior characteristics of claim 1, wherein the vehicle model is structurally restrained in a forward/rearward direction to facilitate determination of a moment equilibrium according to a force equilibrium.

5. The method for predicting dynamic behavior characteristics of claim 2, wherein a front wheel is configured to be restrained and a rear wheel is configured to undergo a forward/rearward movement such that a wheel base change that is brought about during roll behavior by a forward/rearward movement of the contact patch caused by geometries of the front and rear wheels can be reflected in the analysis.

6. The method for predicting dynamic behavior characteristics of claim 5, wherein a forward/rearward displacement of a front contact patch is measured while bumping and rebounding the vehicle in a state of removing all forward/rearward restraints, and a value obtained by a sine function approximation is used as a front wheel displacement restraint condition.

7. The method for predicting dynamic behavior characteristics of claim 1, wherein in the quasi-static analysis, when comparing a plurality of results of the quasi-static analysis for different vehicle models, a camber change tendency and a toe change tendency are set as similar values between the models, and a roll center at an initial position is set to be the same in each model.

8. The method for predicting dynamic behavior characteristics of claim 1, wherein in the step of estimating roll behavior, a point where the fixed screw axis intersects a surface that passes through a center of a front wheel and is perpendicular to a vehicle driving direction is considered as a roll center of the front wheel, a point where the fixed screw axis insects a surface that passes through a center of gravity is considered as a roll center of the center of gravity, and a point where the fixed screw axis insects a surface that passes through a center of a rear wheel is considered as a roll center of the rear wheel, and wherein a tendency of change of the roll center at the three points is estimated.

9. The method for predicting dynamic behavior characteristics of claim 1, wherein the screw parameters include a first position parameter relating to a vertical migration of a center of gravity of the vehicle model, a second position parameter relating to a lateral migration of a center of gravity of the model, a first direction parameter relating to a pitch motion of the vehicle model, a second direction parameter relating to a yaw motion of the vehicle model, and a pitch parameter relating to a cornering speed.

10. A method for predicting dynamic behavior characteristics of a vehicle, comprising:
    determining screw parameters and gradients of the screw parameters of a fixed screw axis through an analysis of a quasi-static vehicle model; and
    estimating roll behavior of the vehicle based on the determined screw parameters and the gradients of the screw parameters.

11. The method for predicting dynamic behavior characteristics of claim 10, wherein said determining comprises:
    applying a lateral force that increases at a predetermined rate at a center of gravity of the quasi-static vehicle model, and simultaneously applying corresponding lateral forces at each contact patch of the quasi-static vehicle model, so that a force equilibrium in a lateral direction and a moment equilibrium exist; and
    determining the screw parameters and the gradients of the screw parameters of a fixed screw axis based on motions of the quasi-static vehicle model with respect to the ground.

12. The method for predicting dynamic behavior characteristics of claim 10, wherein the screw parameters include a lateral position parameter that relates to a lateral position of the fixed screw axis, and wherein in the step of estimating roll behavior, a center of gravity of a vehicle is estimated to lower if a value of the gradient of the lateral position parameter is negative, and a center of gravity of a vehicle is estimated to rise if a value of the gradient of the lateral position parameter is positive.

13. The method for predicting dynamic behavior characteristics of claim 10, wherein the screw parameters include a vertical position parameter that relates to a vertical position of the fixed screw axis, and wherein in the step of estimating roll behavior, it is estimated that a lateral migration of a center of gravity of the vehicle decreases and a roll angle decreases if a value of a gradient of the vertical position parameter is negative.

14. The method for predicting dynamic behavior characteristics of claim 10, wherein the screw parameters include a lateral direction component of a unit direction vector of the screw axis, and wherein in the step of estimating roll behavior, it is estimated that a vehicle body slants in a forward direction if a value of a gradient of the lateral direction component is negative, and the vehicle body slants in a rearward direction if a value of a gradient of the lateral direction component is positive.

15. The method for predicting dynamic behavior characteristics of claim 10, wherein the screw parameters include a vertical direction component of a unit direction vector of the screw axis, and wherein in the step of estimating roll behavior, a yaw behavior is estimated based on a gradient of the vertical direction component.

16. The method for predicting dynamic behavior characteristics of claim 10, wherein the screw parameters include a pitch parameter relating to a translating motion of a vehicle, and wherein in the step of estimating roll behavior, it is estimated that the vehicle moves in a forward direction along the screw axis if a value of a gradient of the pitch parameter is positive, and the vehicle moves in a rearward direction along the screw axis if a value of a gradient of the pitch parameter is negative.

17. The method for predicting dynamic behavior characteristics of claim 10, wherein the quasi-static vehicle model comprises a body, and a contact patch that is coupled to the body through a spring, and wherein the contact patch is configured to have no structural restraint in a lateral direction.

* * * * *